(12) United States Patent
Laig-Hörstebrock et al.

(10) Patent No.: US 6,362,598 B2
(45) Date of Patent: Mar. 26, 2002

(54) METHOD FOR DETERMINING THE STATE OF CHARGE AND LOADING CAPACITY OF AN ELECTRICAL STORAGE BATTERY

(75) Inventors: Helmut Laig-Hörstebrock, Frankfurt; Eberhard Meissner, Wunstorf; Gerolf Richter, Hildesheim, all of (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 09/843,333

(22) Filed: Apr. 26, 2001

(30) Foreign Application Priority Data

Apr. 29, 2000 (DE) .......................... 100 21 161

(51) Int. Cl.[7] .......................... H02J 7/01; G01N 27/416
(52) U.S. Cl. .......................... 320/132; 324/427
(58) Field of Search .......................... 320/132; 324/427, 324/426, 430, 431

(56) References Cited

FOREIGN PATENT DOCUMENTS

| EP | 0 471 698 B1 | 9/1993 |
| JP | 04095788 A * | 3/1992 ............ G01R/31/36 |
| WO | WO 90/13823 | 11/1990 |

OTHER PUBLICATIONS

P. Baudry et al., Electro–Thermal Modelling of Polymern Lithium Starting Period and Pulse Power, 1995, Journal of Power Sources, vol. 54, pp. 393–396.*

P. Lürkens et al., *Ladezustandsschätzung von Bleibatterien mit Hilfe des Kalman–Filters*, etzArchiv Bd. 8 (1986) H. 7.

* cited by examiner

*Primary Examiner*—Gregory Toatley
(74) *Attorney, Agent, or Firm*—Schnader Harrison Segal Lewis LLP

(57) ABSTRACT

The invention relates to a method for determining the state of charge and loading capacity of an electrical storage battery by measuring current, voltage and temperature and comparing the measured values with the corresponding values for the response of an equivalent circuit diagram of the storage battery, the parameters of the components in the equivalent circuit diagram and the state variables being varied such that the measured values are matched and that the state of charge and loading capacity are determined from the adjusted parameters and state variables determined.

13 Claims, 4 Drawing Sheets

Flow Chart of Equivalent Circuit

Figure 8    Flow Chart of Equivalent Circuit
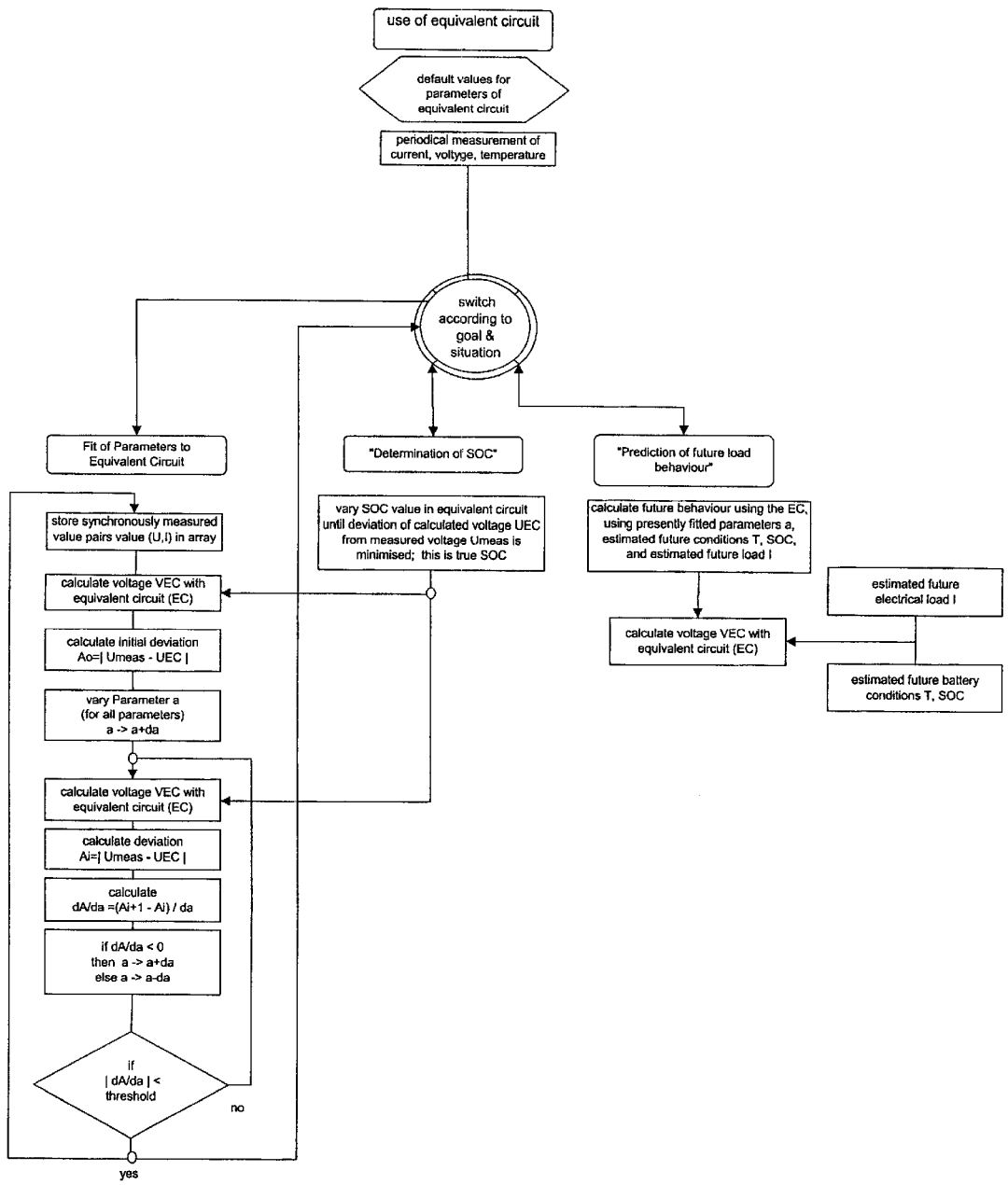

METHOD FOR DETERMINING THE STATE OF CHARGE AND LOADING CAPACITY OF AN ELECTRICAL STORAGE BATTERY

FIELD OF THE INVENTION

The subject matter of this invention is a method for determining the state of charge and loading capacity of an electrical storage battery.

BACKGROUND

It is particularly important for the user of storage batteries to have sufficiently accurate methods available for determining the state of charge and also the loading capacity and availability of a storage battery for a particular application. These need to be determined, for example, in the case of electric driving and electric hybrid driving in a motor vehicle, for assessing the starting ability of an internal combustion engine, for the availability of the power supply for components such as the electrically operated or driven brake systems, steering systems and steering aids, stabilizing systems and for other important functions, and also for the drive mechanisms for components for controlling and regulating electrical parts, particularly for load connection and load disconnection and for voltage regulation, and for display units informing the operator of the vehicle about the operating state.

A wide variety of methods are known for measuring the state of charge of storage batteries. In many cases, integrated meters (current meters) are used. These methods have very good levels of success for batteries in the field of application of full charging and discharging with only rare intermediate charging operations. Errors may arise as a result of inaccuracies in measurement and computation, parasitic charge losses in the storage battery, the aging of the accumulator, and extractable battery capacities changing with the level of the charging or discharging current. However, it is not possible to use such integrating methods to provide a reliable statement about the present level of performance readiness (the product of current times voltage) of the battery, since, for example, the change in the internal resistance is a function of the complete or partial cycles which preceded in terms of time interval and current level.

The weak points mentioned for the charge balancing method can be largely overcome by forming mathematical models of the storage battery. Methods using mathematical models (descriptive equations or mathematically representable equivalent circuit diagrams), which are evaluated on electronic computer systems with the stipulation of a set of basic data typical of the battery, or equivalent circuit diagram component data, make it possible to detect the state of charge of the battery operated simultaneously in parallel with the model. The limiting factor in these methods is merely the quality of the basic model, and the quality of the input parameters in terms of their correspondence to the battery under consideration.

In particular, regulated zero balancing of the output voltage calculated using the model with the actual battery voltage under the conditions of identical temperature and identical current throughput has been found to be particularly useful as an evaluation method. This type of evaluation also permits estimation of the aging processes in the storage battery.

Such methods are disclosed, for example, in EP 471698 B1 (=WO 90/13823), according to which the process input variables (voltage, current, temperature) of the storage battery are measured and processed in a computer, where, according to the principle of indirect measurement, a predeterminable model in the form of multiple-parameter functions, which represents the state of charge and the physical variables to be determined and their physical interrelationships, is compared with the measured process input variables, and, in the event of discrepancies, the model parameters are adapted for the next measurement. To determine the state of charge, a multiple-parameter description in the form of a model is used, for example. However, EP '698 discloses no further details about the actual configuration of the model or of the equivalent circuit diagram.

The publication "Ladezustandsschätzung von Bleibatterien mit Hilfe das Kalman-Filters" [Estimating the state of charge in lead-acid batteries using the Kalman filter] by P. L ürkens and W. Steffens (ETZ Archive, Volume 8 (1986), No. 7, pages 231–236) discloses a method for determining the state of charge, in which the method of state estimation using the Kalman filter is used. That publication also points to a suitable equivalent circuit diagram for a lead-acid storage battery.

SUMMARY OF THE INVENTION

The invention relates to a method for determining the state of charge and loading capacity of an electrical storage battery by measuring current, voltage and temperature and comparing the measured values with the corresponding values for the response of an equivalent circuit diagram of the storage battery, the parameters of the components in the equivalent circuit diagram and the state variables being varied such that the measured values are matched and the state of charge and loading capacity are determined from the adjusted parameters and state variables.

BRIEF DESCRIPTION OF THE DRAWINGS

The method according to the invention is explained in more detail below with the aid of figures. Insofar as specific numerical values are mentioned in these examples, these relate to a 6-cell lead-acid storage battery having a capacity of 60 Ah.

FIG. 8 is a flow diagram showing aspects of the invention in conjunction with Example 1.

DETAILED DESCRIPTION

Figure 1:
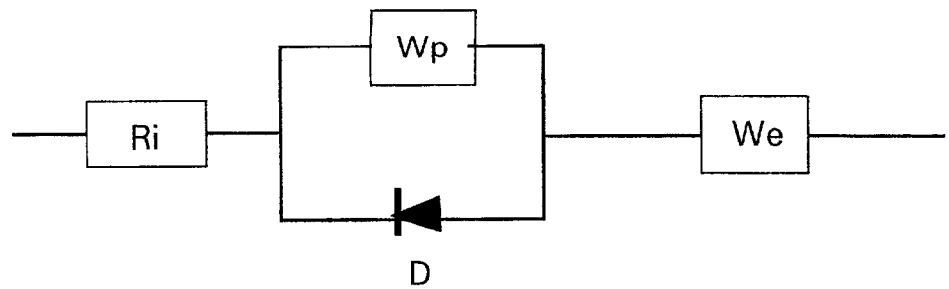
FIG. 1 is a schematic illustration of a circuit in accordance with the invention.
Figure 2:
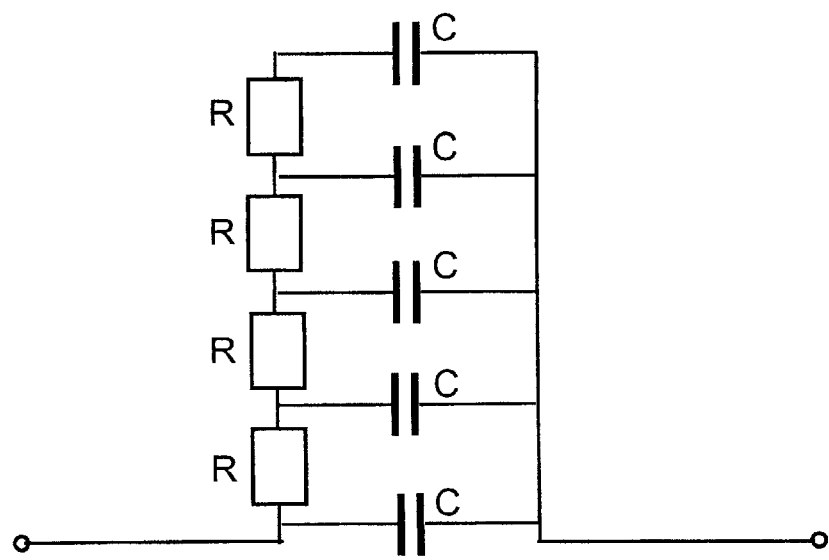
FIG. 2 is a schematic illustration of the structure of a Warburg impedance.

This invention provides a method for determining the state of charge of a storage battery which detects a large charge exchange in relation to the battery capacity, rest periods and standby phases, and also battery aging, and which contains an equivalent circuit diagram simulation which can be used, in particular, in motor vehicles, where mainframes cannot be used.

In the circuit according to the invention, the diffusion processes are described by Warburg impedances. In all battery systems, diffusion inhibition plays a very significant role. This relates both to the diffusion of components in the electrolyte and also to diffusion processes in the active materials. These mechanisms are of crucial significance for the lead-acid storage battery as well, specifically the acid diffusion and the proton diffusion in the positive active material $PbO_2$.

The diffusion elements are thus shown in the electrical circuit as chains of resistors in series and capacitances in parallel therewith. A Warburg impedance in the form of a chain comprising n resistors and capacitors is a physical representation of a division of the space in which the diffusion process takes place into n layers. In this context, the resistors represent the inhibition of the diffusion process between adjoining layers, while the capacitors describe the storage capability of each layer. The number n of layers is defined taking into account the required level of accuracy, on the one hand, and the simplicity of the computational processing, on the other hand.

A circuit according to the invention contains the following specific components:
 an internal resistor Ri,
 a Warburg impedance We for acid diffusion in the storage battery, and
 a parallel circuit comprising a further Warburg impedance Wp for diffusion processes in the active masses and an element D which has a diode-like characteristic curve and contains the kinetic dependencies of the battery, and
 if appropriate, a constant voltage source Uo. In this case, the components Wp and D are connected in parallel with one another, and this parallel circuit is connected in series with the components Uo, Ri and We. In this arrangement, the constant voltage source Uo also takes into account the dependency of the unloaded battery voltage on the present electrolyte concentration.

The Warburg impedance Wp contains resistors which are dependent on current direction and voltage, and the element D has a diode-like characteristic curve having a forward direction for currents in the discharge direction of the storage battery.

The Warburg impedances We and Wp are structural elements which contain at least one parallel circuit comprising a capacitor C with a series circuit comprising a resistor R and a further capacitor C, the respective capacitor C being able to have a further series circuit comprising a resistor and a further capacitor C connected in parallel with it. The number of these parallel circuits is chosen according to the desired level of accuracy.

The Warburg impedances are made of a chain comprising n resistors and capacitors, which is a physical representation of a division of the space in which the diffusion process takes place into n layers. In this context, the resistors represent the inhibition of the diffusion process between adjoining layers, while the capacitors describe the storage capability of each layer. The number n of layers is defined taking into account the required level of accuracy, on the one hand, and the simplicity of the computational processing, on the other hand.

The mean voltage U-We across the capacitors of the electrolyte Warburg impedance We is chosen as a measure of the state of charge SOC of the storage battery, with the state of charge SOC comprising the value range from 0 (for the fully discharged storage battery) to 1 (for the fully charged storage battery). For the state of charge SOC of an individual electrochemical storage cell, $$SOC=Uwe/0.2$$

applies, for example, wherein Uwe is measured in volts. Preferably, the voltage U and the temperature T of the storage battery and also the current I flowing through it are substantially continuously measured simultaneously. Then, starting with a known state of charge of the storage battery, the parameters of the equivalent circuit diagram are varied to minimize the difference between calculated and measured voltage U (e.g. using the least squares method), and an optimum set of internal parameters for the equivalent circuit diagram is determined.

When the state of charge is unknown and the internal parameters of the circuit are known, the state of charge is varied, starting with an estimate state of charge of the storage battery, over a plurality of cycles to calculate the voltage response of the circuit and compare it with the measured voltage response, until calculated and estimated voltages match.

The loading capacity of the storage battery is determined from the circuit's state-of-charge and parameter values obtained in this way, these values are displayed and/or these values are used to derive consequences for the operation of the storage battery and/or of the system connected to the storage battery.

The circuit according to the invention is shown in FIG. 1. It is roughly composed of an ohmic resistor Ri, a parallel circuit comprising a Warburg impedance Wp, which describes the diffusion processes, and a switching element D which has a roughly diode-like response and describes a large part of the kinetic charging, discharging and gassing inhibitions of the storage battery, and also a second Warburg impedance We, which describes the acid diffusion.

Besides the purely ohmic components of the battery, such as discharge resistors and electrolyte resistor in the separation, the resistor Ri also contains resistance components of the electrochemical electrode reactions.

The diffusion processes are described by the Warburg impedances Wp and We. The structure thereof results from the fact that the "diffusion" space is divided into n discrete layers with a particular thickness, and the quantity balances are calculated. The change in the voltage in a layer over a time interval is calculated from the thicknesses of the layer and that of its adjoining layers, the voltages on the latter, and the resistances between the layers, and also the capacitances of the layers.

Figure 3:
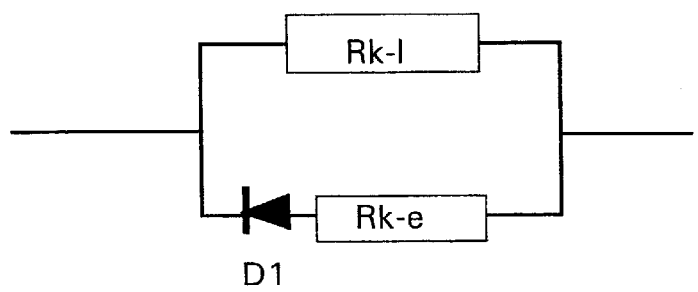
FIG. 3 is a schematic illustration of a circuit for the resistance elements in the Warburg impedance.

The lead-acid storage battery is polarized greatly during charging, whereas it exhibits only a small degree of polarization during discharging, even above the no-load voltage. The invention allows for this by choosing the (diffusion) resistors R of the Warburg impedance Wp variably, depending on current direction. FIG. 3 shows a circuit diagram of these resistors Rk, with the resistor Rk–1 (charging) and the resistor Rk–3 (discharging) and the corresponding decoupling diode D1. This response for charging and discharging is asymmetrical, approximately that of a diode.

Figure 4:
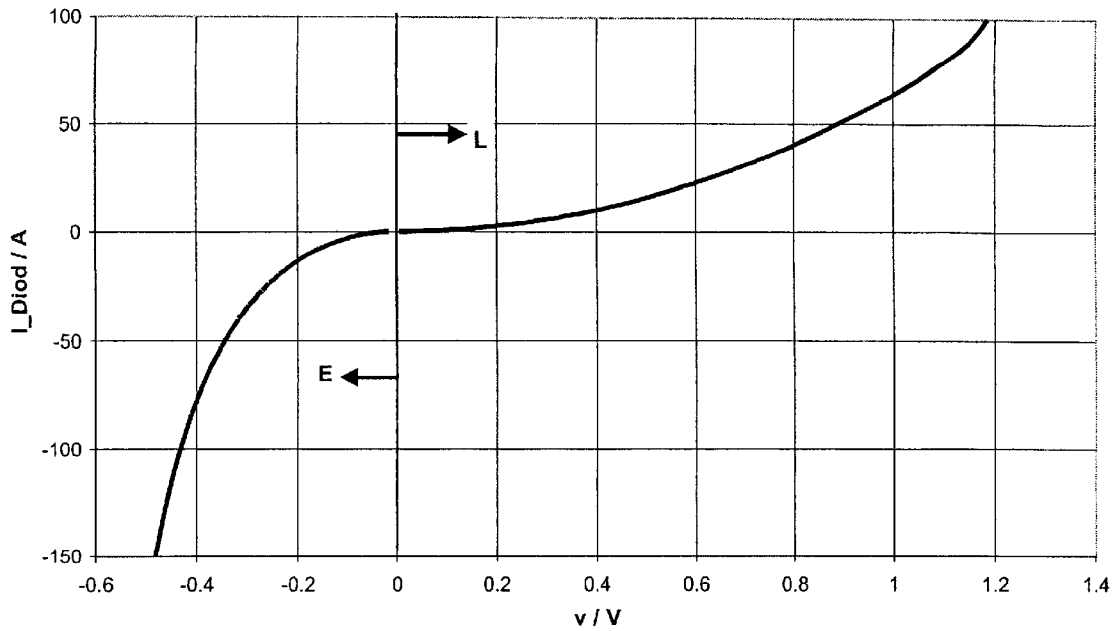
FIGS. 4 and 5 show specific characteristic curves for structural elements used in the circuit.

The diffusion resistor, which can be varied according to current direction, is described by a function whose curve is shown for a 6-cell starter battery having a capacity 60 Ah in FIG. 4.

In a charging situation, the R=Rp. During discharging, on the other hand, R depends on the voltage. For negative voltage values, the diffusion resistor R becomes very small in this case, which means that the Warburg impedance Wp almost becomes a pure capacitance.

Kinetic processes, such as the passage's discharging and charging kinetics and the parasitic gassing reactions, are also taken into account. These are simulated in the diode D, because the charging and discharging kinetics have a rough similarity to a diode characteristic curve.

The individual dependencies are given by way of illustration in the equations below. The formula symbols used for this represent the following variables:

v=voltage across the diode vgr="threshold voltage" of the diode during discharging Uwe=mean charging of the electrolyte Warburg impedance, measure of the state of charge (SOC).

The current/voltage response of the diode-like element D for voltages v>0 across the diode, i.e. for currents in the reverse direction, is simulated by a relationship similar to an exponential law, preferably to the approximate dependency $$I\_Diod = a v^b + Ig * \exp(v/Ug),$$

where a is a parameter of the dimension current/voltage$^b$ and where the dimensionless constant b is chosen such that b>1.5 and preferably b~2 and where v is as defined above. Ig and Ug are parameters describing the gassing. The parameter Ig represents the current and the parameter Ug represents the voltage, and both parameters are adjusted. FIG. 4 shows in the charging region ("L") a typical curve for the above formula for a 60 Ah battery.

The function below for the case v<0 describes a response which still severely inhibits discharging at low overvoltages v but then allows the diode current to rise quadratically with rising magnitude of the overvoltage v, amplifies the diode current still further in the region of the limit voltage vgr by means of a hyperbolic contribution (subformula (A)), but then steadily merges into a pure parabola for numerical reasons (B).

(A) if (v<0) and ($v^2 \leq 0.99 * vgr^2$)

then $I\_Diod := -a * v^2 / (vgr^2 - v^2)$ (B) if (v<0) and ($v^2 > 0.99 * vgr^2$)

then $I\_Diod := -a * (99 + 0.0001 / vgr^2 * (v^2 - 0.99 * vgr^2))$

The preliminary factor a of the [time$^{-1}$] dimension is the adjustment parameter describing the diode and is adjusted in the same way as the threshold voltage parameter vgr.

Such a characteristic curve is shown in FIG. 4 for the example of the lead-acid storage battery mentioned above. FIG. 4 shows, in the discharging region ("E"), the typical curve of the diode current I_Diod as a function of the voltage v across the diode.

An alternative approach which has also been found to be suitable is that having the approximate form $$I\_Diod = Io * \sinh(v/vgr),$$

the Io parameter having the dimension of a current and the threshold voltage parameter vgr having the dimension of a voltage, and both parameters being adjusted. The mean charging Uwe of the Warburg impedance We is a measure of the state of charge SOC.

The charge quantity kap:=∫i*dt which flowed for current i varies the mean voltage Uwe on the Warburg impedance We with the capacitance C, starting from its initial value Start_Uwe in accordance with $$Uwe := Start\_Uwe + kap/C;$$

Hence, the following applies for the state of charge SOC in the case of a 6-cell lead-acid battery:

$$SOC = Uwe/1.2$$

At low states of charge SOC, there is an increasingly greater reduction in the voltage under a given load than at higher states of charge, until the voltage collapses at very low states of charge. It has been shown that the discrepancies at the discharge end can be approximately described by a resistance which increases greatly with the degree of discharge.

The resistances of the Warburg impedance Wp are dependent on current direction. The resistance values of the resistors Rk connected in the Warburg impedance Wp are shown by an equivalent circuit diagram as shown in FIG. 3, comprising a resistor Rk–1, connected in parallel with a resistor Rk–e which is connected in series with an ideal diode D1 in the discharge direction.

The values Rk–1 for all the resistors R are preferably chosen to be the same. The values Rk–e depend on the voltages U across the adjoining capacitors C, particularly on the mean value thereof, this dependency being the same for all the resistors k.

Figure 5:
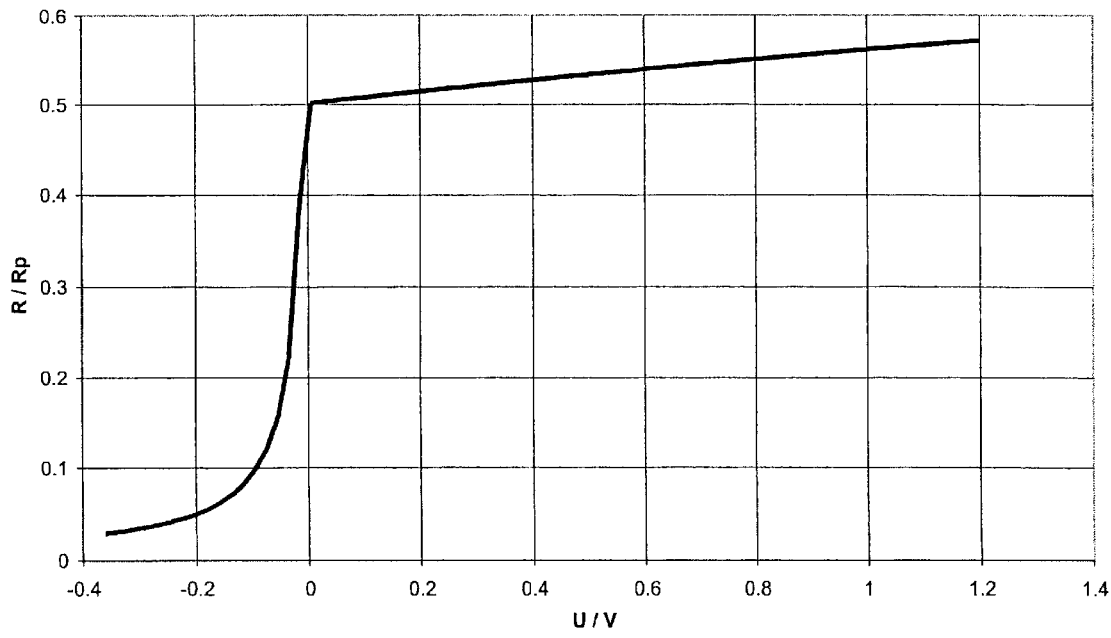

For high positive voltages U, Rk–e is preferably chosen to be in the same order of magnitude as Rk–1. For low voltages U. Rk–e is preferably chosen to be at least one order of magnitude smaller than Rk–1. A steady and monotonous function is preferably chosen as the junction between these extreme values. FIG. 5 shows a typical curve found to be satisfactory. In this, R takes as reference a maximum value Rp, which is one of the adjustment parameters at the same time.

To describe the temperature dependency of parameters and/or constants, a functional relationship is chosen which, for its part, contains parameters and constants, and these parameters and constants P are iteratively optimized, the functional dependency on the temperature preferably having, for example, the form $$P = Po * \exp(-To/T).$$

In this case, the variable Po has the same dimension as the parameter P, and the reference temperature To has the dimension of a temperature.

EXAMPLES

Example 1

A possible way for determination of the parameters of the equiv. Circuit diagram is as follows, shown in the flow chart for this procedure given in FIG. 8, left column (Fit of Parameters to Equivalent Circuit):

a) measure continuously pairs of values (U, I) from the battery b) store the synchronously measured value pairs value (U, I) in an array, e.g. after 200 of such pairs have been measured;

c) Enter point from step 1); the following steps are done every time, when a new pair of measured values (U, I) is available; then the oldest value pair is released from the array, and replaced by the new one (shift register)

d) calculate the voltage responses $UE_C$ of the equivalent circuit (initially using the default parameter values, afterwards the parameter values from the previous iteration) with respect to the applied current values applied to it (which are the same as the current values measured in reality)

e) determine an initial root mean square deviation between measured voltage values $U_{meas}$ and the calculated voltage responses $U_{EC}$ f) vary systematically the values of parameters a, aiming for minimum of the root mean square deviation between measured voltage values $U_{meas}$ and the calculated voltage responses $U_{EC}$ (here, this is given schematically for a single parameter a; also the parameter variation a –> da is indicated also schematically)

g) Enter point from step 1)
h) calculate the voltage responses $U_{EC}$ of the equivalent circuit with respect to the applied current values applied to it (which are the same as the current values measured in reality)
i) determine the root mean square deviation $Ai=|U_{meas}-U_{EC}|$ between measured voltage values $U_{meas}$ and the calculated voltage responses $U_{EC}$ (iteration No. i)
j) calculate dependency of A from parameter a $dA/da=(A_{i+1}, -A_i)/da$
k) change of parameter a depending on the result of dA/da
l) if threshold value of change of the root means square deviation between measured voltage values $U_{meas}$ and the calculated voltage responses $U_{EC}$ is not reached, jump to step g) and continue with the modified parameter a; otherwise, parameter optimization is completed, and the loop to continued at step c), waiting for an update of the (U, I) array; in addition, the parameter set which is fitted to the actual battery situation may be used fro calculation of the present SOC value (center column), and/or for prediction of future battery behavior under estimated future conditions (temperature, SOC) and loads (right column).

Example 2

Figure 6:
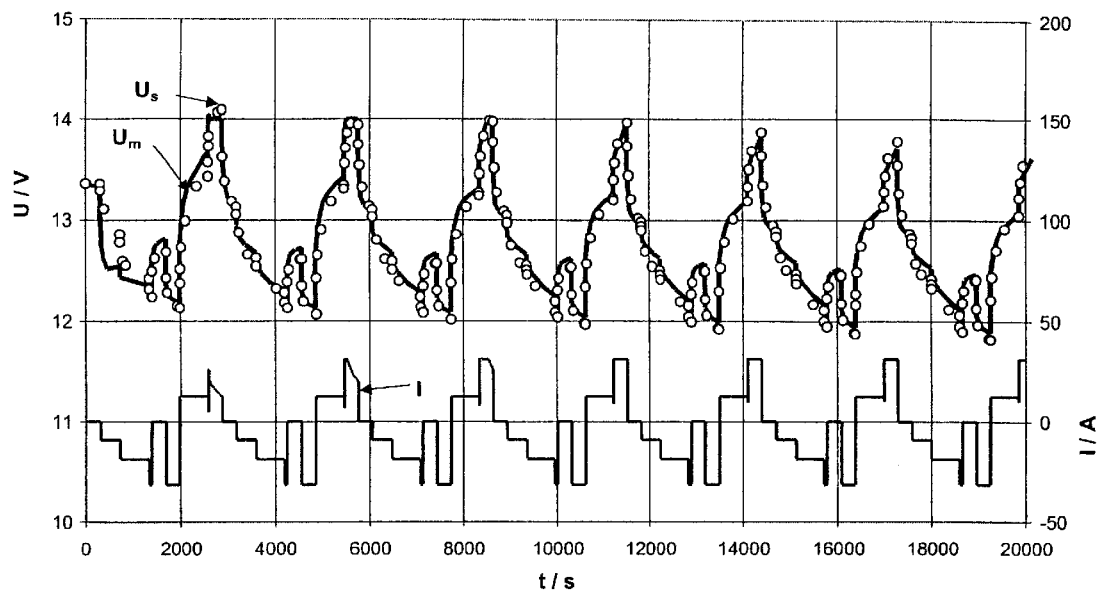
FIGS. 6 and 7 show a comparison between values measured on the illustrative storage battery and the values obtained from the circuit calculation.
Figure 7:
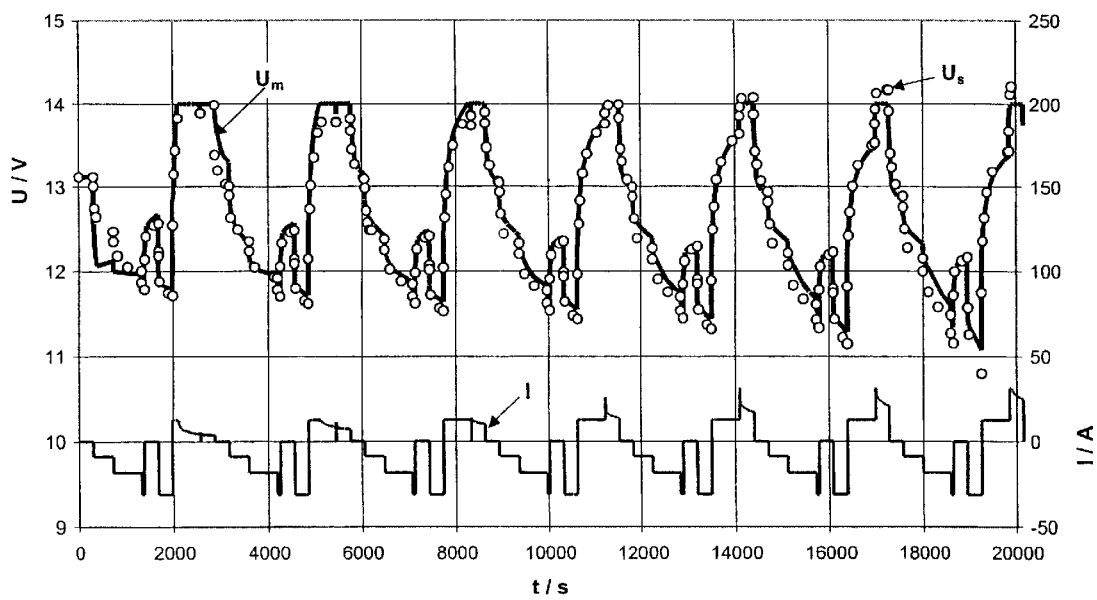

FIGS. 6 and 7 were received by application of the procedure given in FIG. 8.

The quality of the reproduction of the battery response by the equivalent circuit diagram according to the invention can be seen in FIGS. 6 and 7.

The figures show an example of the application of the circuit diagram to a lead-acid starter battery having a rated capacity of 60 Ah. In FIG. 6, the battery is at a temperature of 25° C., in FIG. 7 it is at a temperature of −10° C.

The continuous lines represent the impressed current I and the measured voltage curve $U_m$ of the battery. The open circles represent the voltage response $U_s$ of the adjusted circuit diagram.

The parameter used for reproduction for the battery at 25° C. (FIG. 6) were as follows:

| | |
|---|---|
| Ohmic resistance | Ri = 0.007 ohms |
| Warburg Impedance Wp | Rp = 0.1 ohms, total capacity 12750 F. |
| Warburg Impedance We | Re = 0.0091 ohms, total capacity C = 250730 F |
| Diode recharge direction | a0 = 105 A/V²/V; b = 2; Ig = 5.46e−10 A; Ug = 0.05 V |
| discharge direction | vgr = 0.416 V; a = 23 A. |

Example 3

The invention provides a way for determination of SOC. This is given in the flow chart shown in FIG. 8, center column (Determination of SOC):

as SOC is derived from the mean voltage U−We across the capacitors of the electrolyte Warburg impedance We, SOC is taken from the set of parameters a. This procedure is directly linked to the optimization of the set of all parameters to minimized deviation between measured voltages $U_{meas}$ and voltages $U_{EC}$ simulated using the equivalent circuit.

Example 4

In many cases, not only the present state of charge SOC is of interest, but also the future behavior of the battery in case of a given electrical load is to be predicted. In a vehicle comprising an electrically controlled braking system for instance, it is essential to know of the battery is able to provide the energy for the function of this component just now, even in case if other sources for electrical energy supply (alternator etc.) would fail. In this case, both battery temperature and SOC are the present ones, as well as the parameters of the equivalent circuit.

The method according to the invention permits critical loading situations to be predicted. The circuit diagram used shows the battery response, and only a small amount of computer memory space is required to simulate the charging and discharging response of a storage battery.

This is indicated in the flow chart given in FIG. 8, right column (Prediction of future load behavior).

Furthermore, the invention may be used as a procedure for prediction of the future behavior of the battery, estimating a future battery temperature T and a future battery state of charge SOC, under an estimated future battery current load I, using the parameters for the equivalent circuit diagram fitted to the actual battery behavior. As this set of parameters may be not perfectly representing the future status of the battery, this approach may not so precise as in the case of prediction for the immediate future mentioned before; however, it can be helpful to estimate long-term behavior and may be used to predict the capability of the battery for future tasks, e.g. engine cranking next morning (at another battery temperature, and with a lower SOC due to discharge of the battery by quiescent load in the meantime).

What is claimed is:

1. A method for determining state of charge and loading capacity of an electrical storage battery comprising:
measuring current, voltage and temperature of the battery;
comparing the measured values with corresponding values generated by a circuit of the storage battery;
varying i) selected parameters of components in the circuit and ii) selected state variables such that the measured values are matched and the state of charge and the loading capacity are calculated from adjusted parameters and state variables, wherein the circuit comprises 1) an internal resistor Ri, 2) a parallel circuit comprising a Warburg impedance Wp for diffusion processes in active material in the battery, 3) an element D having a diode characteristic curve and containing kinetic dependencies of the battery, and 4) a Warburg impedance We which represents acid diffusion in the storage battery and, optionally, a constant voltage source Uo, the Warburg impedance Wp containing resistors which depend on current direction and voltage, the diode characteristic curve having a forward direction for currents in a discharge direction of the storage battery, and the Warburg impedances We and Wp containing a capacitor C with which at least one series circuit comprising a resistor R and a further capacitor C is connected in parallel, the further capacitor C optionally having further respective series circuits comprising a resistor and a capacitor connected in parallel, and the constant voltage source Uo depending on present electrolyte concentration, and wherein mean voltage U−We across the capacitors of the electrolyte Warburg impedance We derives a measure of the state of charge, and
calculating the loading capacity of the storage battery from the state-of-charge and parameter values.

2. The method as claimed in claim 1, further comprising:
selecting a known state of charge of the storage battery;

varying parameters of the circuit to minimize differences between calculated and measured voltage U using a least squares calculation, and determining an optimum set of internal parameters for the circuit.

3. The method as claimed in claim 1, wherein current/voltage response of element D for voltages v>0 across the diode satisfies the function:

$$I\_Diod = av^b + Ig*exp(v/Ug)$$

wherein a is based on current/voltage, v is voltage across the diode, Ig and Ug are gassing variables, dimensionless constant b is b>1.5, and Ig, a, Ug are adjusted depending on characteristics of the storage battery.

4. The method as claimed in claim 1, wherein current/voltage response of element D for voltages v<0 across the diode satisfies the functions (A) if (v<0) and ($v^2 \leq 0.99*vgr^2$)
then $I\_Diod := -a*v^2/(vgr_2 - v^2)$ (B) if (v<0) and ($v^2 > 0.99*vgr^2$)
then $I\_Diod := -a*(99 + 0.0001/vgr^2*(v^2 - 0.99*vgr^2))$ wherein a is based on current/voltage, v is voltage across the diode and vgr is the limit voltage of the diode during discharging, and wherein factors a and vgr are adjusted depending on characteristics of the storage battery.

5. The method as claimed in claim 1, wherein current/voltage response of element D for voltages v<0 across the diode satisfy the function $$I\_Diod = Io*sinh(v/vgr)$$

wherein Io is current, v is voltage across the diode and vgr is the limit voltage of the diode during discharging, and wherein parameters Io and vgr are adjusted depending on characteristics of the storage battery.

6. The method as claimed in claim 1, wherein parameter a of element D for voltages v across the diode where v>0, depends on the state of charge SOC and is determined, in accordance with the formula $$a = (1-SOC)^c * a0$$

wherein SOC assumes a value of 1 in a fully charged state of the storage battery and assumes a value of 0 in a fully discharged state, dimensionless exponent c is 0.5<c<2, and a0 is an adjustment parameter for current/voltage.

7. The method as claimed in claim 1, wherein resistance values of the resistors R connected in the Warburg impedance Wp comprise a resistor Rk-1 in parallel with a resistor Rk-e which is connected in series with an ideal diode D1 in a discharge direction, wherein (a) the resistors Rk-1 are the same,
(b) values Rk-e depend on voltages U across adjoining capacitors,
(c) for high positive voltages U, Rk-e is on the same order of magnitude as Rk-1,
(d) for low voltages U, Rk-e is at least one order of magnitude smaller than Rk-1, and
(e) a steady and monotonous function is used as a junction between extreme values.

8. The method as claimed in claim 1, wherein, to describe temperature dependency of parameters and/or constants, a functional relationship is used which contains parameters and constants P, and wherein the parameters and constants P are iteratively optimized, the functional dependency on the temperature T having the form $$P = Po*exp(-To/T),$$

wherein Po is an initial constant and To is an initial temperature.

9. The method as claimed in claim 1, further comprising displaying the state of charge and/or loading capacity values.

10. The method as claimed in claim 1, further comprising calculating consequences to operation of the storage battery and/or systems connected to the storage battery.

11. The method of claim 1, further comprising:

a) when the state of charge is unknown and the internal parameters of the circuit are known, selecting an estimated state of charge of the storage battery;

b) varying the state of charge over a plurality of cycles and calculating a voltage response of the circuit;

c) comparing voltage response with measured voltage response, repeating steps a) and b) until calculated and estimated voltages match; and d) determining the loading capacity of the storage battery from state-of-charge and parameter values obtained.

12. The method as claimed in claim 11, further comprising displaying the state of charge and/or loading capacity values.

13. The method as claimed in claim 11, further comprising calculating consequences to operation of the storage battery and/or systems connected to the storage battery.

* * * * *